(12) United States Patent
Nl

(10) Patent No.: US 9,899,628 B2
(45) Date of Patent: Feb. 20, 2018

(54) ULTRAVIOLET LED LIGHT SOURCE AND CURING AND PACKAGING DEVICE AND METHOD FOR OLED DEVICE

(71) Applicant: Shenzhen China Star Optoelectronics Technology Co., Ltd., Shenzhen, Guangdong (CN)

(72) Inventor: Kui Nl, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 266 days.

(21) Appl. No.: 14/426,977

(22) PCT Filed: Aug. 15, 2014

(86) PCT No.: PCT/CN2014/084454
§ 371 (c)(1),
(2) Date: Mar. 9, 2015

(87) PCT Pub. No.: WO2016/011689
PCT Pub. Date: Jan. 28, 2016

(65) Prior Publication Data
US 2016/0268543 A1    Sep. 15, 2016

(30) Foreign Application Priority Data
Jul. 23, 2014    (CN) .......................... 2014 1 0353000

(51) Int. Cl.
H01L 51/52    (2006.01)
H01L 51/56    (2006.01)
B05D 3/06    (2006.01)

(52) U.S. Cl.
CPC ............ H01L 51/5253 (2013.01); B05D 3/06 (2013.01); H01L 51/56 (2013.01)

(58) Field of Classification Search
CPC .......................... H01L 51/5253; H01L 51/56
See application file for complete search history.

(56) References Cited

U.S. PATENT DOCUMENTS

2006/0233501 A1 * 10/2006 Sampson .................. F26B 3/28
385/115
2009/0316383 A1 * 12/2009 Son .......................... F21V 9/10
362/84

FOREIGN PATENT DOCUMENTS

CN    101697270 A    4/2010
CN    102760837 A    10/2012
CN    103000821 A    3/2013

* cited by examiner

Primary Examiner — Joseph L Williams
(74) Attorney, Agent, or Firm — Andrew C. Cheng

(57) ABSTRACT

The present invention provides an ultraviolet LED light source and an device curing and packaging device and method. The ultraviolet LED light source (3) includes a PCB (31) and a plurality of ultraviolet LED lights (33) mounted on the PCB (31). The plurality of ultraviolet LED lights (33) is distributed in a longitudinal direction and a lateral direction of the PCB (31) to form an array. The PCB (31) includes a driving circuit corresponding to each of the ultraviolet LED lights (33) for controlling activation and deactivation of each of the ultraviolet LED lights (33) thereby achieving selective control of an illumination area of the ultraviolet LED light source (3). Using the ultraviolet LED light source to carry out curing and packaging of an OLED device may omit a masking plate and effectively protect an organic light emissive layer.

10 Claims, 4 Drawing Sheets

ULTRAVIOLET LED LIGHT SOURCE AND CURING AND PACKAGING DEVICE AND METHOD FOR OLED DEVICE

BACKGROUND OF THE INVENTION

1. Field of the Invention

The present invention relates to the field of manufacture of OLED (Organic Light Emitting Diode) devices, and in particular to an ultraviolet LED (Light Emitting Diode) light source and a curving and packaging device and method for an OLED device.

2. The Related Arts

Organic light emitting diodes (OLEDs) have a variety of advantages, such as being self-luminous, low driving voltage, high luminous efficiency, shortened response time, high clarity and contrast, approximately 180° view angle, wide operation temperature range, and being capable of achieving flexible displaying and large area full color displaying, and are regarded as displaying devices having the best prosperous future of development.

In a manufacturing process of an OLED device, adhesively bonding a substrate and a lid together to achieve cured package for preventing invasion of moisture and oxygen into the interior is a technique of vital importance. The result of cured package directly affects the performance of the interior components of the OLED.

Ultraviolet (UV) curing technology is the most commonly used technique for packaging an OLED device. Irradiating liquid UV resin with ultraviolet radiation induces a cross-linking reaction occurring in the UV resin to achieve fast solidification and shaping. UV curing possesses the following advantages. No or minor solvent is used so as to reduce the environmental contamination caused by solvents. Energy consumption is small for curving can be achieved at a low temperature and application to temperature sensitive material is available. Curing speed is high and the efficiency is thus high, allowing for application in a high-speed manufacturing line, and the curing facility occupies a small floor area.

Conventional ultraviolet light sources often comprise strong ultraviolet light high-voltage mercury lamps, which are vacuum linear light sources that are made of high quality pure quartz tubes, allowing massive penetration of ultraviolet lights. The strong ultraviolet light high-voltage mercury lamps have an illumination length from 5 mm to 300 mm and an effective range of spectrum between 350-450 nm with a primary wave peak of 365 nm.

Referring to FIG. 1, which is a schematic view showing a conventional OLED device curing and packaging device, the device comprises a UV curing chamber 100, an OLED device to be packaged 200 positioned in the UV curing chamber 100, and a plurality of strong ultraviolet light high-voltage mercury lamps 300 arranged under the OLED device to be packaged 200. The plurality of strong ultraviolet light high-voltage mercury lamps 300 emits ultraviolet light that, besides irradiating a UV resin frame for packaging the OLED device, also irradiates an organic light emissive layer. The large power ultraviolet light readily damage the organic light emissive layer so as to speed up aging of the organic light emissive layer, leading to occurrence of dark spots during the operation thereof to thereby affect the performance of the OLED device and shorten the lifespan of the OLED device. Thus, the conventional OLED device curing and packaging device additionally comprises a masking plate 400 positioned between the OLED device to be packaged 200 and the plurality of strong ultraviolet light high-voltage mercury lamps 300. The arrangement of the masking plate 400 protects the organic light emissive layer and reduces the damage of the organic light emissive layer caused by irradiation of the ultraviolet light. Thus, to curve and package OLED devices of different sizes, masking plates of different sizes and thicknesses must be used and this increases the manufacturing cost.

On the other hand, the plurality of strong ultraviolet light high-voltage mercury lamps 300 is linear light sources. To achieve uniformity of the light irradiating a large-sized OLED device to be packaged 200, the distance H' between the plurality of strong ultraviolet light high-voltage mercury lamps 300 and the OLED device to be packaged 200 is relatively large, around 60 cm, and this causes an increase of the height of a UV curing device and also greatly increase the power consumption of the strong ultraviolet light high-voltage mercury lamps, leading to a waste of energy. Further, the time period within which the strong ultraviolet light high-voltage mercury lamps are capable of emitting a sufficient UV power is often not exceeding 1500 hours so that the lifespan is relatively short.

SUMMARY OF THE INVENTION

An object of the present invention is to provide an ultraviolet light-emitting diode (LED) light source wherein by using such an ultraviolet LED light source to carry out curing and packaging of an organic light emitting diode (OLED) device, omission of a masking plate is achieved and effective protection of an organic light emissive layer is realized.

Another object of the present invention is to provide an OLED device curing and packaging device, which allows for omission of a masking plate, effective protection of an organic light emissive layer is realized, reduction of manufacturing cost and reduction of energy consumption, and extension of a lifespan of an ultraviolet light source.

A further object of the present invention is to provide an OLED device curing and packaging method, which needs no use of a masking plate and is capable of reducing manufacturing cost and reducing energy consumption.

To achieve the above object, the present invention provides an ultraviolet LED light source, which comprises a printed circuit board (PCB) and a plurality of ultraviolet LED lights mounted on the PCB. The plurality of ultraviolet LED lights is arranged to distribute in a longitudinal direction and a lateral direction of the PCB to form an array. The PCB comprises a driving circuit corresponding to each of the ultraviolet LED lights so as to control activation and deactivation of each of the ultraviolet LED lights thereby selectively controlling an illumination area of the ultraviolet LED light source.

The ultraviolet LED light source has an effective illumination area of 730 mm×460 mm.

The ultraviolet LED light source has a light intensity≥100 mw/cm$^2$.

The ultraviolet LED lights have an effective spectrum range of 350-450 nm with a peak at wavelength 365 nm.

The present invention also provides an organic light emitting diode (OLED) device curing and packaging device, which comprises: a ultraviolet (UV) curing chamber, an OLED device to be packaged being positionable in the UV curing chamber, and an ultraviolet LED light source that is arranged in the UV curing chamber and located under the OLED device to be packaged. The ultraviolet LED light source comprises a PCB and a plurality of ultraviolet LED lights mounted on the PCB. The plurality of ultraviolet LED lights is arranged to distribute in a longitudinal direction and a lateral direction of the PCB to form an array. The PCB comprises a driving circuit corresponding to each of the ultraviolet LED lights so as to control activation and deactivation of each of the ultraviolet LED lights thereby selectively controlling an illumination area of the ultraviolet LED light source to have the illumination area corresponding to a UV resin frame of the OLED device to be packaged.

The ultraviolet LED light source has an effective illumination area of 730 mm×460 mm, having a light intensity≥100 mw/cm$^2$, and the ultraviolet LED lights have an effective spectrum range of 350-450 nm with a peak at wavelength 365 nm.

A distance between the ultraviolet LED light source and the OLED device to be packaged is H≤5 mm.

The OLED device curing and packaging device further comprises a reflector plate arranged below the ultraviolet LED light source.

The present invention further provides an OLED device curing and packaging method, which comprises the following steps:

(1) providing a UV curing chamber;

wherein the UV curing chamber comprises an ultraviolet LED light source arranged therein and a reflector plate arranged under the ultraviolet LED light source, the ultraviolet LED light source comprising a PCB and a plurality of ultraviolet LED lights mounted on the PCB, the plurality of ultraviolet LED lights being arranged in an array extending in a longitudinal direction and a lateral direction of the PCB, the PCB comprising a driving circuit corresponding to each of the ultraviolet LED lights for controlling activation and deactivation of each of the ultraviolet LED lights;

(2) depositing an OLED device to be packaged in the UV curing chamber with the OLED device to be packaged being located above the ultraviolet LED light source;

(3) controlling driving circuits of the PCB to activate the ultraviolet LED lights that are located in an area corresponding to a UV resin frame of the OLED device to be packaged so as to irradiate and thus cure the UV resin frame; and (4) after curing, controlling the driving circuits of the PCB to deactivate the ultraviolet LED lights that are located in the area corresponding to the UV resin frame of the OLED device to be packaged to complete packaging.

The ultraviolet LED light source has an effective illumination area of 730 mm×460 mm, having a light intensity≥100 mw/cm$^2$, and the ultraviolet LED lights have an effective spectrum range of 350-450 nm with a peak at wavelength 365 nm; and a distance between the ultraviolet LED light source and the OLED device to be packaged is H≤5 mm.

The efficacy of the present invention is that the present invention provides an ultraviolet LED light source, which comprises a plurality of ultraviolet LED lights arranged in an array and having an illumination area that is selectively controllable through a PCB, so that the ultraviolet LED light source, when used to cure and package an OLED device, can omit a masking plate and effectively protect an organic light emissive layer. The present invention provides an OLED device curing and packaging device, which comprises the ultraviolet LED light source and controls an illumination area thereof to correspond to a UV resin frame of the OLED device to be packaged so as to omit a masking plate, effectively protect an organic light emissive layer, reduce manufacturing cost and also reduce energy consumption, and extend the lifespan of an ultraviolet light source. The present invention provides an OLED device curing and packaging method, which achieves curing and packaging through controlling the ultraviolet LED lights located in an area corresponding to a UV resin frame of an OLED device to be packaged without using a masking plate, so as to reduce the manufacturing cost and reduce energy consumption.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
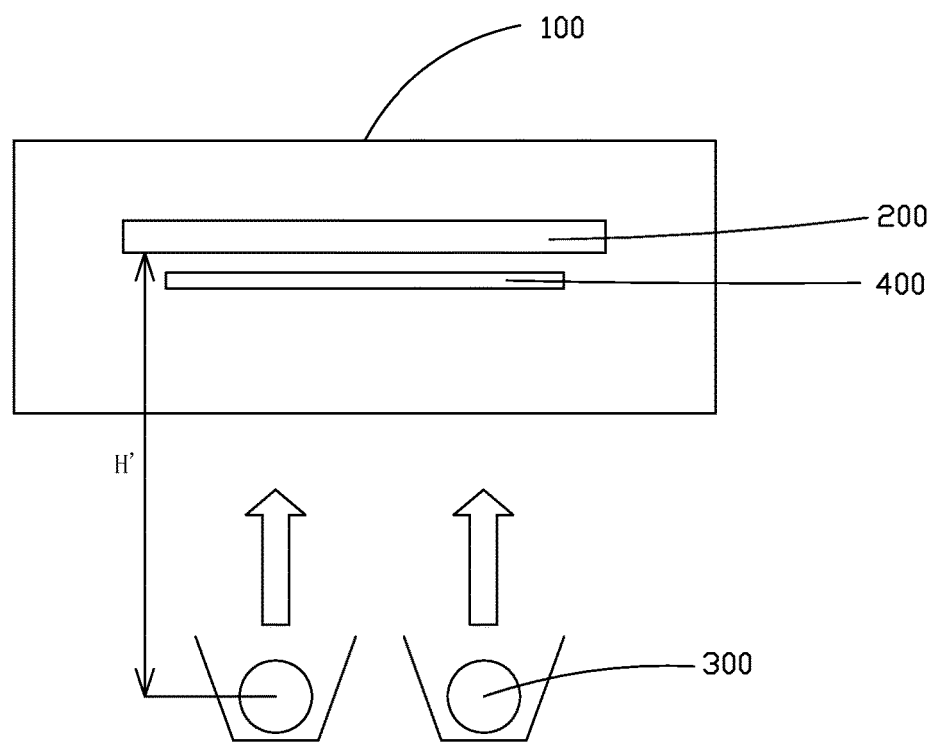
FIG. 1 is a schematic primary view showing a conventional curing and packaging device for an OLED (Organic Light Emitting Diode) device.
Figure 2:
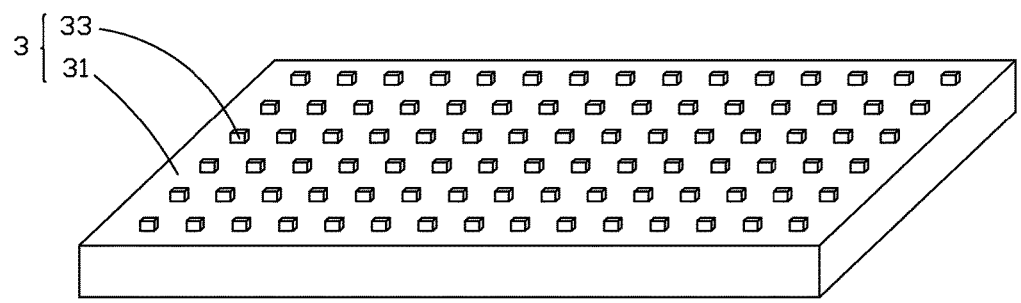
FIG. 2 is a perspective view showing an ultraviolet LED light source according to the present invention.

Referring to FIG. 2, firstly, the present invention provides an ultraviolet LED (LED) light source. The ultraviolet LED light source 3 comprises a PCB (Printed Circuit Board) 31 and a plurality of ultraviolet LED lights 33 mounted on the PCB 31. The plurality of ultraviolet LED lights 33 is distributed in a longitudinal direction and a lateral direction of the PCB 31 so as to form an array. The PCB 31 comprises a driving circuit (not shown) corresponding to each of the ultraviolet LED lights 33 for controlling activation and deactivation of each of the ultraviolet LED lights 33, thereby achieving selective control of an illumination area of the ultraviolet LED light source 3.

Specifically, the ultraviolet LED light source 3 has an effective illumination area of 730 mm×460 mm, which has light intensity≥100 mw/cm$^2$. The ultraviolet LED lights 33 have an effective spectrum range of 350-450 nm with a peak at wavelength 365 nm.

Compared to a strong violet light high-voltage mercury lamp, the ultraviolet LED light source 3, on the one hand, has an extended lifespan, excellent heat dissipation so that the lifespan of such an ultraviolet LED light source of a high quality may have a lifespan reaching as long as fifth thousand hours under a condition of constant current driving, and on the other hand, has excellent performance of high light intensity and low light attenuation. Further, the ultraviolet LED light source has a relatively small thermal radiation and belongs to a cold light source, making it environment-friendly and low energy consuming. More importantly, the plurality of ultraviolet LED lights 33 of the ultraviolet LED light source 3 are arranged to distribute in the longitudinal and lateral directions of the PCB 31 to form an array so as to provide a planar light source, which emits ultraviolet light of uniformity and allows for selective control of the illumination area thereof by means of the PCB 3. The ultraviolet LED light source 3, when used for curing and packaging of an OLED device, can, on the one hand, be placed relatively close to the LED device to greatly reduce energy consumption and, on the other hand, allows for omission of a masking plate and effective protection of an organic light emissive layer.

Figure 3:
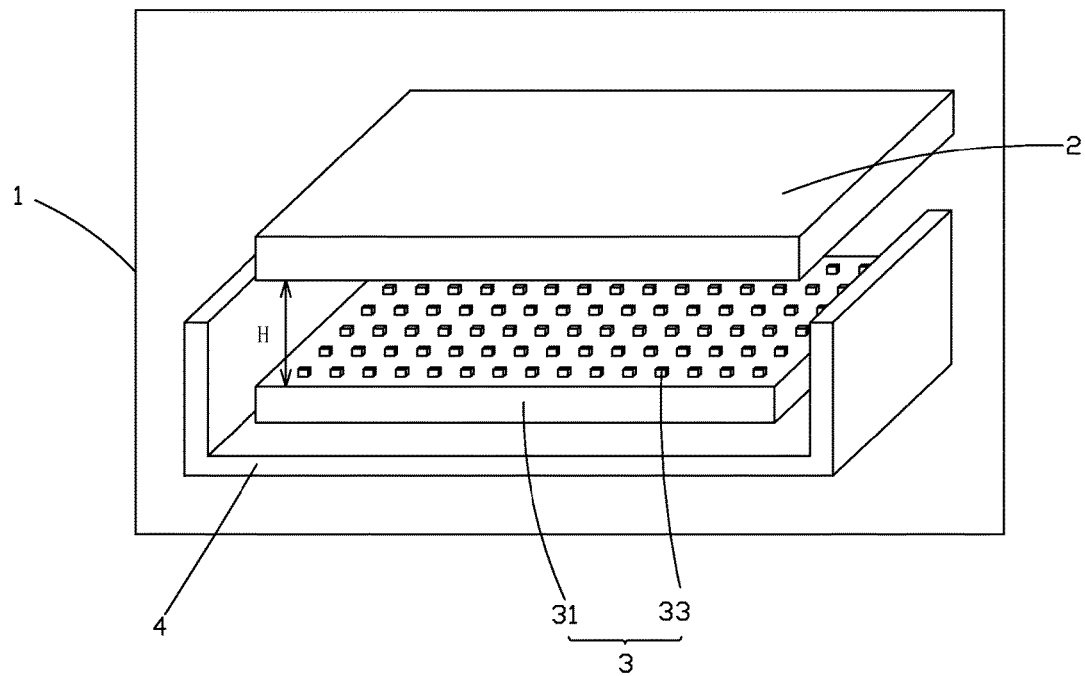
FIG. 3 is a perspective view showing an OLED device curing and packaging device according to the present invention.
Figure 4:
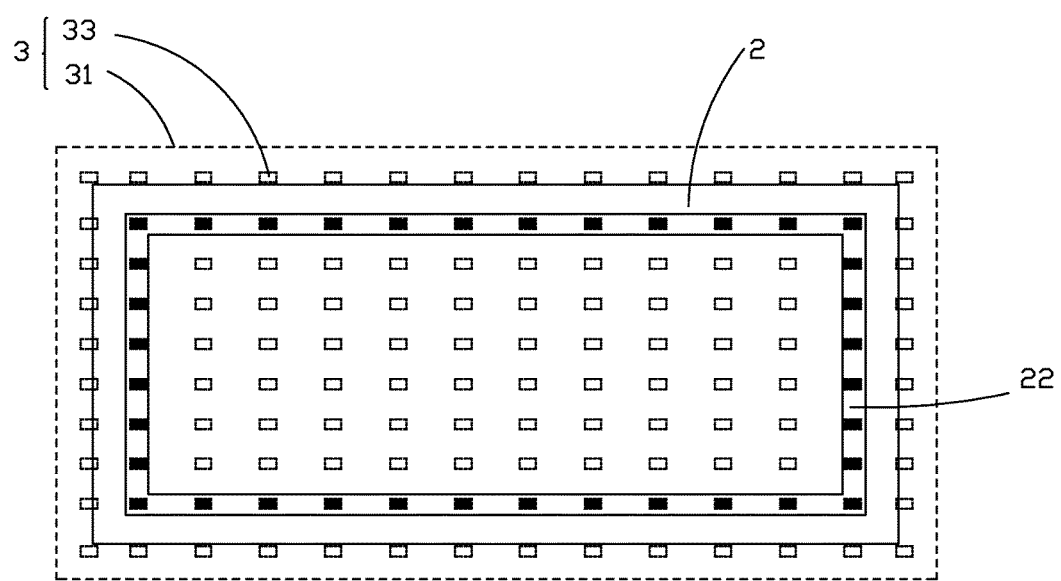
FIG. 4 is a schematic top plan view showing an ultraviolet LED light source of the OLED device curing and packaging device and an OLED device to be packaged.

Referring to FIGS. 3 and 4, with additional reference being had to FIG. 2, the present invention further provides an OLED device curing and packaging device, which comprises: a UV curing chamber 1, an OLED device to be packaged being positionable in the UV curing chamber 1, an ultraviolet LED light source 3 that is arranged in the UV curing chamber 1 and located under the OLED device to be packaged 2, and a reflector plate 4 arranged below the ultraviolet LED light source 3.

Further, the ultraviolet LED light source 3 comprises a PCB 31 and a plurality of ultraviolet LED lights 33 mounted on the PCB 31. The plurality of ultraviolet LED lights 33 is arranged in an array extending in a longitudinal direction and a lateral direction of the PCB 31. The PCB 31 comprises a driving circuit corresponding to each of the ultraviolet LED lights 33 for controlling activation and deactivation of each of the ultraviolet LED lights 33, thereby achieving selective control of an illumination area of the ultraviolet LED light source 3 to have the illumination area corresponding to a UV resin frame of the OLED device to be packaged 2, while no illumination is made in other areas, so as to save the use of a masking plate and also protect an organic light emissive layer contained in the OLED device to be packaged 2 from being damaged by the ultraviolet light.

Specifically, the ultraviolet LED light source 3 has an effective illumination area of 730 mm×460 mm, which has light intensity≥100 mw/cm$^2$. The ultraviolet LED lights 33 have an effective spectrum range of 350-450 nm with a peak at wavelength 365 nm.

The distance between the ultraviolet LED light source 3 and the OLED device to be packaged 2 is H≤5 mm, which greatly reduces energy consumption.

As shown in FIG. 4, when the OLED device curing and packaging device is put into operation, through controlling the driving circuits of the PCB 31, only the ultraviolet LED lights 33 that are in an area corresponding to the UV resin frame 22 of the OLED device to be packaged 2 are activated to irradiate and thus cause curing of the UV resin frame 22, while the ultraviolet LED lights 33 in other areas are kept deactivated so as not to cause damages to an organic light emissive layer contained in the OLED device to be packaged 2. For different sizes of the OLED device to be packaged 2, it only needs to adjust and control the illumination area of the ultraviolet LED light source 3 to have the illumination area corresponding to the resin frame 22 of the OLED device to be packaged 2 so that there is no need to use masking plates of various sizes and thereby reducing the manufacturing cost.

Figure 5:
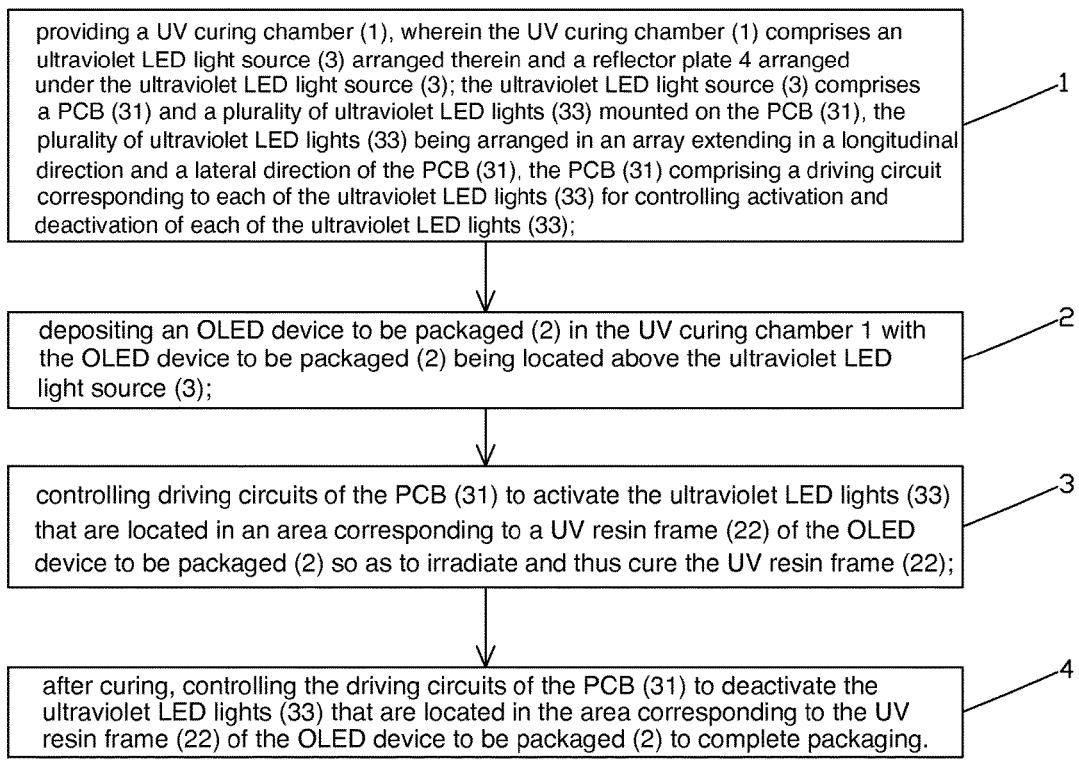
FIG. 5 is a flow chart illustrating an OLED device curing and packaging method according to the present invention.

Referring to FIG. 5, with additional reference being had to FIGS. 2-4, based on the OLED device curing and packaging device described above, the present invention further provides an OLED device curing and packaging method, which comprises the following steps:

Step 1: providing a UV curing chamber 1.

The UV curing chamber 1 comprises an ultraviolet LED light source 3 arranged therein and a reflector plate 4 arranged under the ultraviolet LED light source 3. The ultraviolet LED light source 3 comprises a PCB 31 and a plurality of ultraviolet LED lights 33 mounted on the PCB 31. The plurality of ultraviolet LED lights 33 is arranged in an array extending in a longitudinal direction and a lateral direction of the PCB 31. The PCB 31 comprises a driving circuit (not shown) corresponding to each of the ultraviolet LED lights 33 for controlling activation and deactivation of each of the ultraviolet LED lights 33.

Specifically, the ultraviolet LED light source 3 has an effective illumination area of 730 mm×460 mm, which has light intensity≥100 mw/cm$^2$. The ultraviolet LED lights 33 have an effective spectrum range of 350-450 nm with a peak at wavelength 365 nm.

Step 2: depositing an OLED device to be packaged 2 in the UV curing chamber 1 with the OLED device to be packaged 2 being located above the ultraviolet LED light source 3.

Specifically, the distance between the ultraviolet LED light source 3 and the OLED device to be packaged 2 is H≤5 mm, which greatly reduces energy consumption.

Step 3: controlling driving circuits of the PCB 31 to activate the ultraviolet LED lights 33 that are located in an area corresponding to a UV resin frame 22 of the OLED device to be packaged 2 so as to irradiate and thus cure the UV resin frame 22.

Step 3 omits the use of a masking plate so as to reduce cost and not to cause damages to an organic light emissive layer contained in the OLED device to be packaged 2.

Step 4: after curing, controlling the driving circuits of the PCB 31 to deactivate the ultraviolet LED lights 33 that are located in the area corresponding to the UV resin frame 22 of the OLED device to be packaged 2 to complete packaging.

In summary, the present invention provides an ultraviolet LED light source, which comprises a plurality of ultraviolet LED lights arranged in an array and having an illumination area that is selectively controllable through a PCB, so that the ultraviolet LED light source, when used to cure and package an OLED device, can omit a masking plate and effectively protect an organic light emissive layer. The present invention provides an OLED device curing and packaging device, which comprises the ultraviolet LED light source and controls an illumination area thereof to correspond to a UV resin frame of the OLED device to be packaged so as to omit a masking plate, effectively protect an organic light emissive layer, reduce manufacturing cost and also reduce energy consumption, and extend the lifespan of an ultraviolet light source. The present invention provides an OLED device curing and packaging method, which achieves curing and packaging through controlling the ultraviolet LED lights located in an area corresponding to a UV resin frame of an OLED device to be packaged without using a masking plate, so as to reduce the manufacturing cost and reduce energy consumption.

Based on the description given above, those having ordinary skills of the art may easily contemplate various changes and modifications of the technical solution and technical ideas of the present invention and all these changes and modifications are considered within the protection scope of right for the present invention.

What is claimed is:

1. An ultraviolet light-emitting diode (LED) light source adapted to irradiate ultraviolet light toward an OLED device to be packaged, comprising a printed circuit board (PCB) having a first surface and a second, opposite surface and a plurality of ultraviolet LED lights mounted on the first surface of the PCB, the plurality of ultraviolet LED lights being arranged to distribute in a longitudinal direction and a lateral direction of the PCB to form an array, the PCB comprising a driving circuit corresponding to each of the ultraviolet LED lights so as to control activation and deactivation of each of the ultraviolet LED lights to emit ultraviolet light thereby selectively controlling an illumination area of the ultraviolet light emitting from the ultraviolet LED light source;

wherein a reflector plate is arranged at one side of the PCB corresponding to the second surface so as to be opposite to the ultraviolet LED lights; and wherein the ultraviolet LED lights of the array collectively define an irradiation area that is larger than a size of the OLED device to be packaged so that the ultraviolet LED lights of the array are operable in-site to selectively make the illumination area of the ultraviolet LED light source large enough to cover the size of the OLED device to be packaged, wherein the illumination area of the ultraviolet LED light source is determined according to a number of the plurality of ultraviolet LED lights activated.

2. The ultraviolet LED light source as claimed in claim 1, wherein the ultraviolet LED light source has an effective illumination area of 730 mm×460 mm.

3. The ultraviolet LED light source as claimed in claim 2, wherein the ultraviolet LED light source has a light intensity≥100 mw/cm$^2$.

4. The ultraviolet LED light source as claimed in claim 1, wherein the ultraviolet LED lights have an effective spectrum range of 350-450 nm with a peak at wavelength 365 nm.

5. An organic light emitting diode (OLED) device curing and packaging device, comprising: a ultraviolet (UV) curing chamber, an OLED device to be packaged being positionable in the UV curing chamber, and an ultraviolet light-emitting diode (LED) light source that is arranged in the UV curing chamber and located under and facing the OLED device to be packaged, the ultraviolet LED light source comprising a printed circuit board (PCB) having a first surface and a second, opposite surface and a plurality of ultraviolet LED lights mounted on the first surface of the PCB, the plurality of ultraviolet LED lights being arranged to distribute in a longitudinal direction and a lateral direction of the PCB to form an array, the PCB comprising a driving circuit corresponding to each of the ultraviolet LED lights so as to control activation and deactivation of each of the ultraviolet LED lights to emit ultraviolet light thereby selectively controlling an illumination area of the ultraviolet light emitting from the ultraviolet LED light source to have the illumination area corresponding to a UV resin frame of the OLED device to be packaged;

wherein a reflector plate is arranged at one side of the PCB corresponding to the second surface so as to be opposite to the ultraviolet LED lights; and wherein the ultraviolet LED lights of the array collectively define an irradiation area that is larger than a size of the OLED device to be packaged so that the ultraviolet LED lights of the array are operable in-site to selectively make the illumination area of the ultraviolet LED light source large enough to cover the size of the OLED device to be packaged, wherein the illumination area of the ultraviolet LED light source is determined according to a number of the plurality of ultraviolet LED lights activated.

6. The OLED device curing and packaging device as claimed in claim 5, wherein the ultraviolet LED light source has an effective illumination area of 730 mm×460 mm, having a light intensity≥100 mw/cm$^2$, the ultraviolet LED lights having an effective spectrum range of 350-450 nm with a peak at wavelength 365 nm.

7. The OLED device curing and packaging device as claimed in claim 5, wherein a distance between the ultraviolet LED light source and the OLED device to be packaged is H≤5 mm.

8. The OLED device curing and packaging device as claimed in claim 5, wherein the reflector plate that is arranged opposite to the ultraviolet LED lights comprises two side walls extending from opposite edges thereof in a direction toward the PCB and shield two opposite lateral sides of the PCB, respectively.

9. An organic light emitting diode (OLED) device curing and packaging method, comprising the following steps:

(1) providing a UV curing chamber;

wherein the UV curing chamber comprises an ultraviolet light-emitting diode (LED) light source arranged therein and a reflector plate arranged under the ultraviolet LED light source, the ultraviolet LED light source comprising a printed circuit board (PCB) having a first surface and a second, opposite surface and a plurality of ultraviolet LED lights mounted on the first surface of the PCB, the plurality of ultraviolet LED lights being arranged in an array extending in a longitudinal direction and a lateral direction of the PCB, the PCB comprising a driving circuit corresponding to each of the ultraviolet LED lights for controlling activation and deactivation of each of the ultraviolet LED lights; and wherein a reflector plate is arranged at one side of the PCB corresponding to the second surface so as to be opposite to the ultraviolet LED lights;

(2) depositing an OLED device to be packaged in the UV curing chamber with the OLED device to be packaged being located above the ultraviolet LED light source;

(3) controlling driving circuits of the PCB to activate the ultraviolet LED lights that are located in an area corresponding to a UV resin frame of the OLED device to be packaged so as to irradiate and thus cure the UV resin frame; and (4) after curing, controlling the driving circuits of the PCB to deactivate the ultraviolet LED lights that are located in the area corresponding to the UV resin frame of the OLED device to be packaged to complete packaging;

wherein the ultraviolet LED lights of the array collectively define an irradiation area that is larger than a size of the OLED device to be packaged so that the ultraviolet LED lights of the array are operable in-site to selectively make the illumination area of the ultraviolet LED light source large enough to cover the size of the OLED device to be packaged, wherein the illumination area of the ultraviolet LED light source is determined according to a number of the plurality of ultraviolet LED lights activated.

10. The OLED device curing and packaging method as claimed in claim 9, wherein the ultraviolet LED light source has an effective illumination area of 730 mm×460 mm, having a light intensity≥100 mw/cm$^2$, the ultraviolet LED lights having an effective spectrum range of 350-450 nm with a peak at wavelength 365 nm; and a distance between the ultraviolet LED light source and the OLED device to be packaged is H≤5 mm.

* * * * *